(12) United States Patent
Alptekin

(10) Patent No.: US 8,298,895 B1
(45) Date of Patent: Oct. 30, 2012

(54) SELECTIVE THRESHOLD VOLTAGE IMPLANTS FOR LONG CHANNEL DEVICES

(75) Inventor: Emre Alptekin, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/285,282

(22) Filed: Oct. 31, 2011

(51) Int. Cl.
*H01L 21/336* (2006.01)

(52) U.S. Cl. .. 438/276; 438/289; 438/525; 257/E21.443

(58) Field of Classification Search ............... 438/275, 438/276, 289, 290, 291, 525; 257/392, E21.421, 257/E21.443, E21.444
See application file for complete search history.

(56) References Cited

U.S. PATENT DOCUMENTS

| | | | |
|---|---|---|---|
| 6,040,208 A * | 3/2000 | Honeycutt et al. | 438/229 |
| 6,238,982 B1 * | 5/2001 | Krivokapic et al. | 438/275 |
| 6,417,550 B1 | 7/2002 | Madurawe et al. | |
| 6,468,849 B1 | 10/2002 | Efland et al. | |
| 6,562,713 B1 * | 5/2003 | Belyansky et al. | 438/631 |
| 6,664,594 B2 | 12/2003 | Klodzinski | |
| 7,030,637 B2 | 4/2006 | Berthold et al. | |
| 7,276,407 B2 | 10/2007 | Yamagata et al. | |
| 7,422,948 B2 | 9/2008 | Williford | |
| 7,488,653 B2 * | 2/2009 | Menut et al. | 438/276 |
| 7,514,308 B2 | 4/2009 | Varghese et al. | |
| 7,879,669 B1 | 2/2011 | Teng et al. | |
| 7,952,149 B2 * | 5/2011 | Dokumaci et al. | 257/391 |
| 2004/0248358 A1 * | 12/2004 | Komori | 438/238 |
| 2009/0321850 A1 | 12/2009 | Griebenow et al. | |

* cited by examiner

*Primary Examiner* — Tuan N. Quach
(74) *Attorney, Agent, or Firm* — Jason H. Sosa; Ian D. Mackinnon

(57) ABSTRACT

In a replacement metal gate process flow, sacrificial gates are exposed and removed subsequent to the formation of source and drain regions for various transistor devices. Sidewalls formed adjacent to the sacrificial gates remain. By using an angled implant such that, for a short-channel device, the remaining sidewalls shadow and protect the exposed short-channel region, a designer may adjust the threshold voltage on long-channel devices without affecting the threshold voltage of the short-channel device.

8 Claims, 5 Drawing Sheets

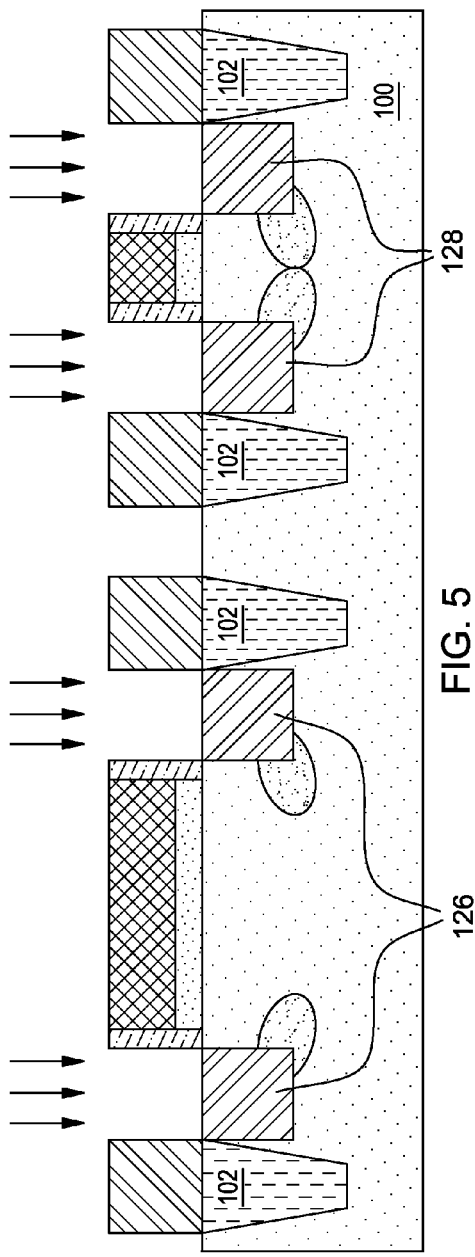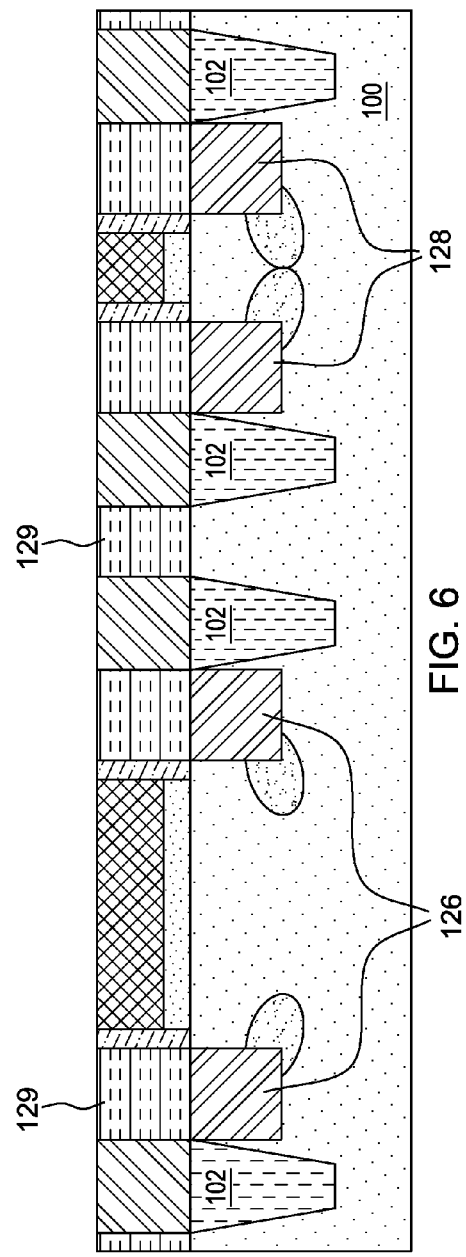

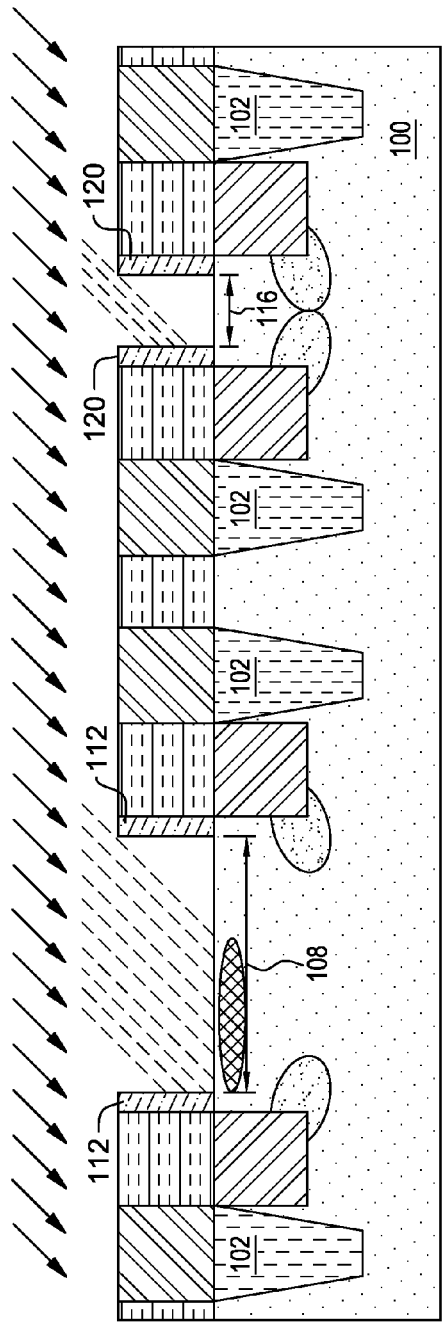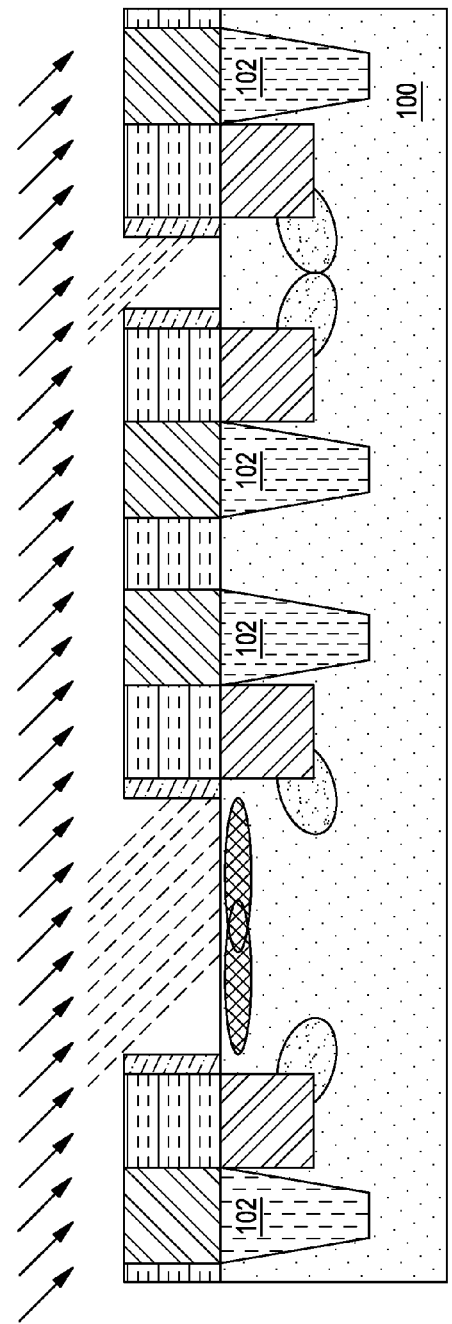

SELECTIVE THRESHOLD VOLTAGE IMPLANTS FOR LONG CHANNEL DEVICES

FIELD OF THE INVENTION

This disclosure relates generally to semiconductor devices and more specifically to selectively doping transistor device channels to adjust the threshold voltage.

BACKGROUND OF THE INVENTION

A typical semiconductor transistor device comprises a gate, which has a conductive element stacked onto a dielectric layer on a semiconductor substrate, and doped regions within the substrate on either side of the gate. The dielectric layer is typically an oxide and is often referred to as the gate oxide. One doped region is referred to as a source, the other as a drain, indicating the direction of current flow. The portion of the substrate beneath the gate oxide and in between the source and drain is referred to as the channel region. Such a transistor is often referred to as a Metal-Oxide-Semiconductor (MOS) transistor.

During operation of a transistor, electrons flow from the source region to the drain region, through the channel region, when an electric field is established between the source and drain regions. Furthermore, the drain-to-substrate junction is reverse biased when a gate voltage equal to or greater than the threshold voltage (Vt) of the transistor is applied to the gate. These conditions can be met, for example, when a ground is applied to the substrate and the source region, and one volt, for example, is applied to the drain region.

A gate voltage applied to the gate attracts electrons to the surface adjacent to the gate oxide of the substrate in the channel region. When a minimum number of electrons have been attracted to the surface of the substrate in the channel region, the electrons form a channel which allows the electrons in the source region to flow to the drain region under the influence of the electric field. The threshold voltage is defined as the minimum gate voltage that must be applied to the gate to attract the minimum number of electrons to the surface of the substrate to form an electrically conductive inversion region in the channel region (i.e., the minimum voltage required to turn the transistor on).

The threshold voltage of the transistor may be altered or adjusted by implanting the surface of the substrate in the channel region with a dopant. For example, in an N-MOS transistor, implanting a p-type dopant decreases the number of electrons that can be accumulated at the surface of the channel region. Since fewer electrons are available, a higher gate voltage is needed to attract the minimum number of electrons that are required to form an inversion layer in the channel region. Such an implant may be referred to as a threshold voltage adjustment implant, a Vt adjustment implant, a Vt implant, or an enhancement implant.

MOS transistors are formed using photolithographic processes according to design rules corresponding to a particular process. The design rules specify, among other things, the minimum length of the channel region. To gain performance advantages and as processing technology advancements have been achieved, the channel length between the source and drain has generally shortened. Furthermore, to minimize the substrate area consumed by a MOS circuit, a typical integrated circuit design is largely implemented with transistors that have the minimum channel length. Since the circuit is largely implemented with transistors that have the minimum channel length, the fabrication process is commonly optimized to adjust the threshold voltages of the transistors which have the minimum channel length. While performance improvement is generally a paramount objective for MOS circuit design, it is common for circuits, in addition to utilizing transistors having minimum channel length, to also require transistors which have channel lengths longer than the minimum. For those transistors with a longer channel length, a lower or higher threshold voltage can be realized when the threshold voltage is optimized for a shorter channel transistor through the use of a single enhancement implant.

To affect different threshold voltages in long channel devices and short channel devices, it is known in the art to utilize multiple Vt adjustment implants requiring separate masks.

SUMMARY

One aspect of an embodiment of the present invention discloses a method for selectively doping long channel devices. The method comprises forming a plurality of device regions on a semiconductor substrate where a first device region is designed for a long channel device and a second device region is designed for a short channel device. The method further comprises forming a first dummy gate having a first set of spacers along the sides thereof for the long channel device, wherein the first dummy gate is formed over a channel region for the long channel device on a portion of the semiconductor substrate within the first device region. The method further comprises forming a second dummy gate having a second set of spacers along the sides thereof for the short channel device, wherein the second dummy gate is formed over a channel region for the short channel device on a portion of the semiconductor substrate within the second device region, and wherein the channel region for the long channel device is longer than the channel region for the short channel device. The method further comprises removing the first and second dummy gates without removing the first and second sets of spacers and implanting a dopant into the semiconductor substrate at an angle at which a height of the first and second sets of spacers at least partially prevents the dopant from reaching the channel region for the short channel device but allows the dopant to reach the channel region for the long channel device. Finally, the method comprises forming a first replacement gate within the first set of spacers and a second replacement gate within the second set of spacers.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which:

FIG. 5 depicts the formation of source and drain regions on either side of the long-channel region under a dummy gate of FIG. 3 and the formation of source and drain regions on either side of the short-channel region under another dummy gate of FIG. 3.

FIG. 6 depicts the deposition of a dielectric layer over the device regions of FIG. 2, covering the source and drain regions of FIG. 5, and the subsequent planarization of the dielectric layer to expose the tops of the dummy gates created in FIG. 3.

FIGS. 7 and 8 depict the selective doping of the long-channel region wherein FIG. 7 shows an angled implantation coming from the right side and FIG. 8 shows an angled implantation coming from the left side.

DETAILED DESCRIPTION

Figure 1:
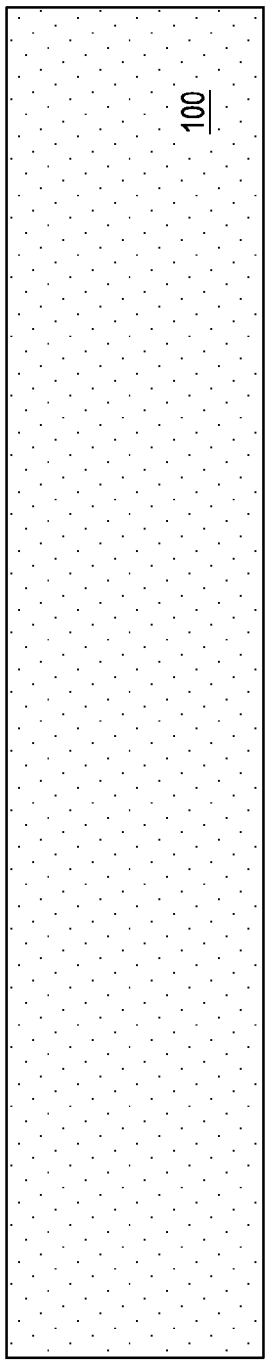
FIG. 1 depicts a semiconductor substrate upon which embodiments of the invention may be fabricated.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on", "positioned on" or "positioned atop" mean that a first element, such as a first structure, is present on a second element, such as a second structure, wherein intervening elements, such as an interface structure may be present between the first element and the second element. The term "direct contact" means that a first element and a second element are connected without any intermediary conducting, insulating or semiconductor layers at the interface of the two elements.

FIG. 1 depicts a semiconductor substrate upon which embodiments of the invention may be fabricated. Semiconductor substrate 100 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. Semiconductor substrate 100 may also be composed of other semiconductor materials, such as germanium, and compound semiconductor substrates, such as type III/V semiconductor substrates, e.g., GaAs. Although semiconductor substrate 100 is depicted as a bulk semiconductor substrate, semiconductor on insulator (SOI) substrate arrangements, such as silicon on insulator substrates, are also suitable for semiconductor substrate 100. Semiconductor substrate 100 is preferably a p-type substrate.

Figure 2:
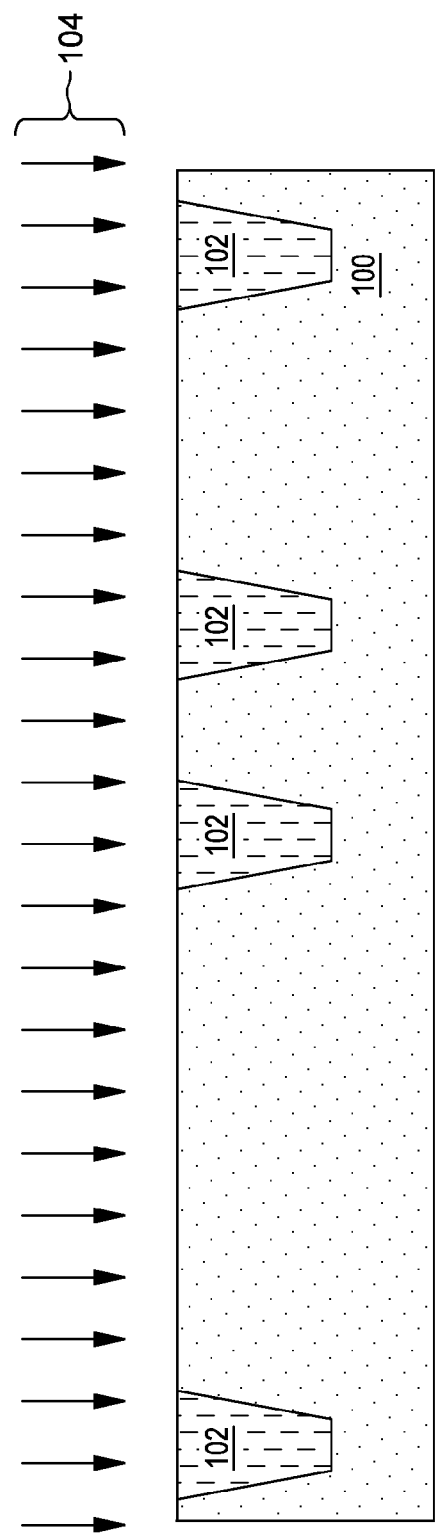
FIG. 2 depicts an embodiment where device regions are created on substrate of FIG. 1 through dielectric trench isolation.

FIG. 2 depicts an embodiment, where device regions are created on substrate 100 through dielectric trench isolation. Isolation barriers 102 are formed within substrate 100. In a preferred embodiment, isolation barriers 102 are filled with one or more dielectric materials. This prevents electrical current leakage between adjacent semiconductor device components, preventing one device region from affecting another or shorting out through contact with another. In various embodiments, isolation barriers 102 may be at varying depths to form instances of shallow trench isolation (STI) or deep trench isolation.

In a preferred embodiment, subsequent to the formation of isolation barriers 102, implants 104 are used to form wells and to adjust threshold voltage for devices to be formed. The dopant may be an n-type dopant (e.g., phosphorous) or a p-type dopant (e.g., boron) depending on the desired effect on the subsequently formed devices.

Figure 3:
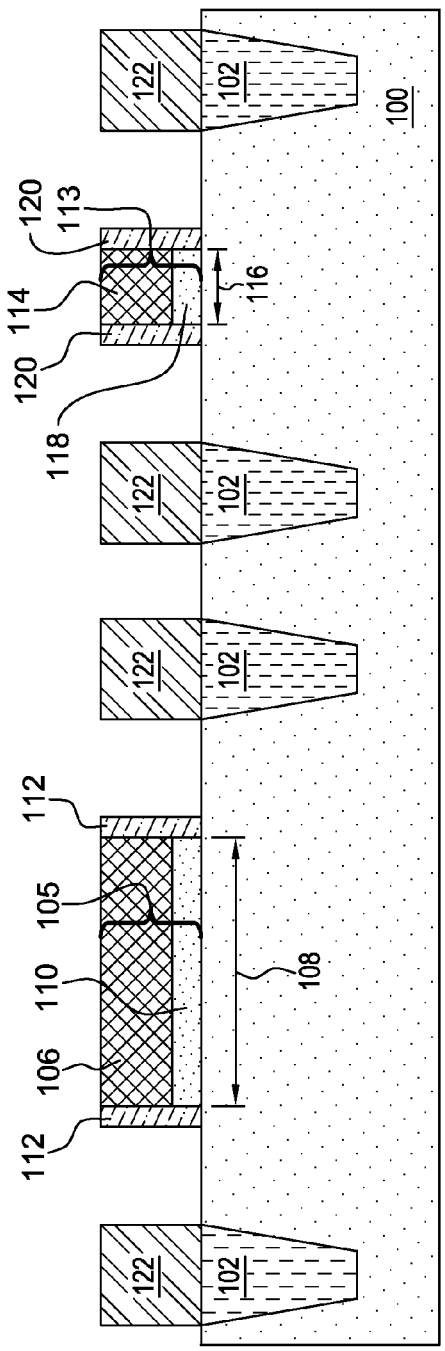
FIG. 3 depicts the formation of dummy gates in the device regions created in FIG. 2.

In FIG. 3, dummy gates are formed in the device regions on substrate 100. When forming semiconductor devices, gates for the devices may be formed before or after source and drain regions, depending on the process used. Source and drain formation includes a number of high-temperature steps (e.g., implants and anneals). In a gate-first process, due to the high-temperatures, the choice of conductive materials used for the gate is limited. For this reason, a gate-last process is preferred. One common implementation of a gate-last process is referred to as a replacement metal gate process. In the replacement metal gate process, a "dummy" gate (sacrificial gate structure) is formed and, after formation of the source and drain regions, may be selectively etched and replaced.

In FIG. 3, dummy gate 105 is formed on substrate 100 over a long-channel region 108 for a field-effect transistor (FET) in one device region and dummy gate 113 is formed over a short-channel region 116 for a FET in another device region. One exemplary process for forming the dummy gates comprises depositing a dielectric layer over substrate 100 and a polysilicon layer over the dielectric layer. A lithography/gate etch process removes unnecessary portions of the stacked layers to leave dummy gate 105, comprised of gate dielectric layer 110 (also referred to as the gate oxide) and polysilicon layer 106, and dummy gate 113, comprised of gate dielectric 118 and polysilicon layer 114. A first set of sidewall spacers 112 is formed adjacent to dummy gate 105, i.e., in direct contact with the sidewall of dummy gate 105. A second set of sidewall spacers 120 is formed adjacent to dummy gate 113. A sidewall spacer typically has a width ranging from 2.0 nm to 15.0 nm, as measured from the sidewall of a gate structure. Sidewall spacers 112 and 120 may be composed of a dielectric, such as a nitride, oxide, oxynitride, or a combination thereof. In one embodiment, spacers 112 and 120 are composed of silicon nitride ($Si_3N_x$). Those skilled in the art will recognize that a "set" of sidewall spacers may actually comprise a single spacer formed around the entire gate. In one embodiment, prior to formation of sidewall spacers, source and drain extension regions may be formed.

Ultimately, dummy gate 105 and dummy gate 113 may be comprised of any material that can be etched selectively to the underlying upper semiconductor layer, such as channel region 108 and 116, respectively. Various processes for forming sacrificial gates and the order of the steps are known in the art. In the depicted embodiment, barriers 122 are additional dielectric barriers between device regions left behind during the lithography/gate etch process.

Figure 4:
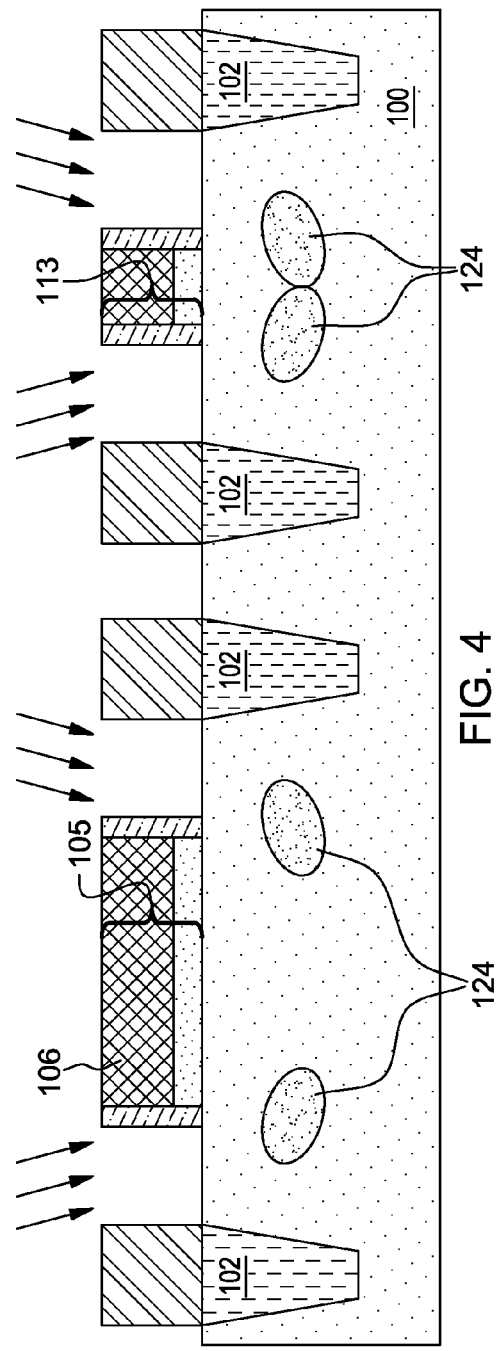
FIG. 4 depicts a halo doping process for affecting long-channel and short-channel devices.

FIG. 4 depicts a halo doping process for long-channel region 108 and short-channel region 116. To combat draininduced barrier lowering (DIBL), MOSFET channels are more doped near the source and drain terminals (not yet formed in the depicted figure) to reduce the size of the depletion region in the vicinity of these junctions (called halo doping to describe the limitation of this heavy doping to the immediate vicinity of the junctions). An angled ion implantation method is used to form halo doped regions 124 within substrate 100 and interior to the sides of dummy gate 105 and dummy gate 113. Though FIG. 4 depicts the angled implantation only at the effected regions, actual implanting occurs as a blanket doping at the same angle across the substrate and a second blanket doping from the opposite direction.

At short channel lengths, such as short-channel region 116, the halo doping of the source overlaps that of the drain, increasing the average channel doping concentration, and thus increasing the threshold voltage. This increased threshold voltage requires a larger gate voltage for channel inversion. However, this may result in non-uniform channel doping. As channel length is increased, such as in long-channel region 108, the halo doped regions become separated and the doping mid-channel approaches a lower background level dictated by the body doping. This reduction in average channel doping concentration means Vt initially is reduced as channel length increases, but approaches a constant value independent of channel length for large enough lengths. This effect is known as the reverse short-channel effect (RSCE).

FIG. 5 depicts the formation of source and drain regions 126 on either side of long-channel region 108 and the formation of source and drain regions 128 on either side of short-channel region 116. In one embodiment, source and drain regions 126 and source and drain regions 128 are formed using an ion implantation process. Source and drain regions 126 and 128 typically have the opposite conductivity as the halo doped regions 124.

Referring to FIG. 6, dielectric layer 129 is deposited atop semiconductor substrate 100 and its devices. Dielectric layer 129 may be deposited using chemical vapor deposition (CVD). Variations of CVD processes include but are not limited to atmospheric pressure CVD (APCVD), low pressure CVD (LPCVD), plasma enhanced CVD (PECVD), and others. Other deposition techniques may be used.

Following deposition, dielectric layer 129 is planarized until the upper surfaces of dummy gate 105 and dummy gate 113 are exposed. "Planarization" is a material removal process that employs at least mechanical forces, such as frictional media, to produce a planar surface. In one embodiment, the planarization process includes chemical mechanical polishing (CMP) or grinding. CMP is a material removal process using both chemical reactions and mechanical forces to remove material and planarize a surface. The preferred method for exposing polysilicon layer 106 and polysilicon layer 114 is known as poly open planarization (POP) chemical-mechanical planarization (CMP), or a poly open CMP.

FIGS. 7 and 8 depict the selective doping of long-channel region 108. Once the gate stack is exposed, dummy gate 105 and dummy gate 113 are removed through a selective etch process, selective to the substrate/channel material, sidewall spacers 112 and 120, and dielectric layer 129. In another embodiment, a first etch removes polysilicon layers 106 and 114 and is selective to gate dielectrics 110 and 118 (and sidewall spacers 112 and 120 and dielectric layer 129), and a second etch removes gate dielectrics 110 and 118 and is selective to the substrate/channel material (and sidewall spacers 112 and 120 and dielectric layer 129).

The etch may be an isotropic etch or an anisotropic etch. The anisotropic etch may include reactive-ion etching (RIE). Other examples of anisotropic etching that can be used at this point of the present discourse include ion beam etching, plasma etching or laser ablation. In comparison to anisotropic etching, isotropic etching is non-directional. One example of an isotropic etch is a wet chemical etch.

The removal of dummy gates 105 and 113 exposes the respective device channel regions 108 and 116. A blanket angled Vt adjustment implant process is used across substrate 100. The angle is such that sidewall spacers 120 at least partially shadow short-channel region 116, preventing the dopant from reaching substrate 100 at short-channel region 116 and affecting the threshold voltage. Sidewall spacers 112, on the other hand, are spaced farther apart than sidewall spacers 120 and allow the angled Vt adjustment implant access to a portion of long-channel region 108 on substrate 100. To dope long-channel region 108 more evenly, the angled Vt adjustment implant is done from both sides. This may be referred to as a dual implant. In an embodiment where not all gates on the substrate are aligned in the same direction, a quad implant may be used where angled implants are directed at the substrate from four sides.

The result is an adjustment in the threshold voltage of long-channel region 108 without affecting the threshold voltage of short-channel region 116 and without the use of additional masks and masking steps.

Figure 9:
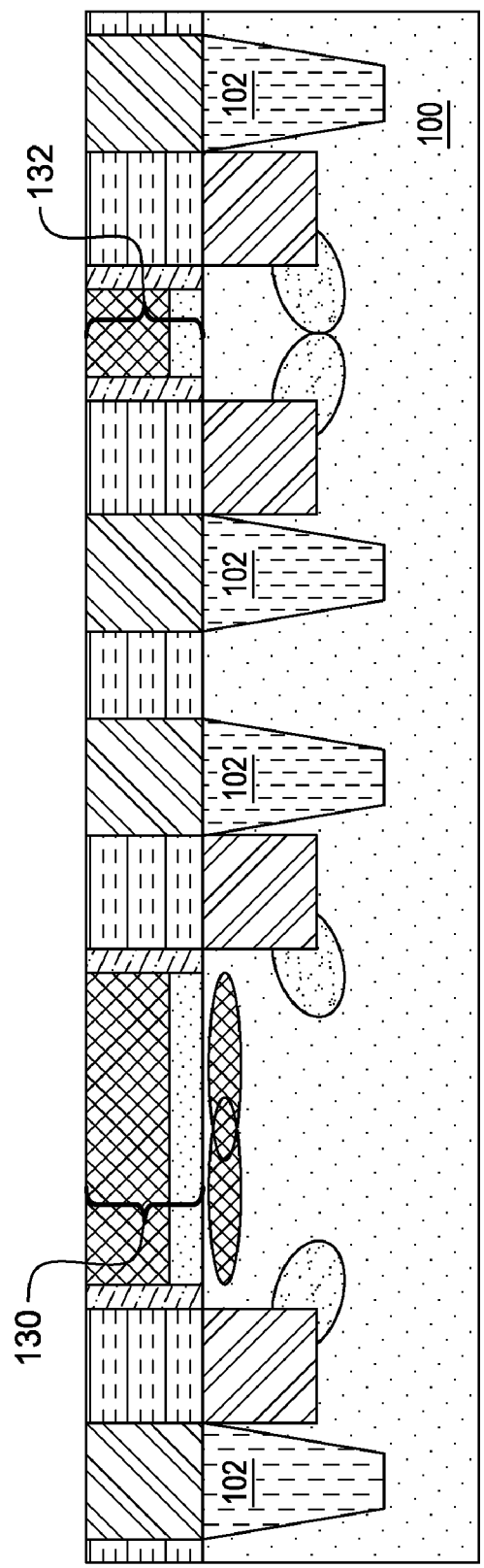
FIG. 9 depicts forming replacement gates between respective sets of sidewall spacers.

Referring to FIG. 9, subsequent to adjusting the threshold voltage of long-channel region 108, replacement gates 130 and 132 are formed between respective sets of sidewall spacers 112 and 120. Middle of the line and back end of the line (BEOL) processes may complete the chip.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a method for selectively adjusting threshold voltage in a long-channel semiconductor device (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method for selectively doping long channel devices, the method comprising the steps of:
   forming a plurality of device regions on a semiconductor substrate where a first device region is designed for a long channel device and a second device region is designed for a short channel device;
   forming a first sacrificial gate and a first set of spacers along the sides thereof, wherein the first sacrificial gate is formed over a channel region for the long channel device on a portion of the semiconductor substrate within the first device region;
   forming a second sacrificial gate and a second set of spacers along the sides thereof, wherein the second sacrificial gate is formed over a channel region for the short channel device on a portion of the semiconductor substrate within the second device region, and wherein the channel region for the long channel device is longer than the channel region for the short channel device;
   removing the first and second sacrificial gates; and
   implanting a dopant into the semiconductor substrate at an angle at which a height of the first and second sets of spacers at least partially prevents the dopant from reaching the channel region for the short channel device but allows the dopant to reach the channel region for the long channel device.

2. The method of claim 1, further comprising the step of implanting a blanket dopant across a surface of the semiconductor substrate prior to the steps of forming the first sacrificial gate and the second sacrificial gate.

3. The method of claim 1, wherein the step of implanting the dopant into the semiconductor substrate at the angle at which the height of the first and second sets of spacers at least partially prevents the dopant from reaching the channel region for the short channel device but allows the dopant to reach the channel region for the long channel device, comprises:
   a first implanting of the dopant at a first angle from one direction; and
   a second implanting of the dopant at a second angle from an other direction.

4. The method of claim 3, wherein the first angle and the second angle are equal.

5. The method of claim 3, wherein the one direction and the other direction are opposite each other.

6. The method of claim 1, further comprising the steps of, subsequent to the steps of forming the first sacrificial gate and the second sacrificial gate, halo doping the first and second device regions.

7. The method of claim 1, further comprising the steps of, subsequent to the steps of forming the first sacrificial gate and the second sacrificial gate, forming a first source region and a first drain region for the long channel device and forming a second source region and a second drain region for the short channel device.

8. The method of claim 1, further comprising the step of forming a first replacement gate within the first set of spacers and a second replacement gate within the second set of spacers.

* * * * *